(12) United States Patent
Wang et al.

(10) Patent No.: US 8,680,751 B2
(45) Date of Patent: Mar. 25, 2014

(54) HYBRID NANOGENERATOR FOR HARVESTING CHEMICAL AND MECHANICAL ENERGY

(75) Inventors: Zhong L. Wang, Atlanta, GA (US); Caofeng Pan, Atlanta, GA (US); Ben Hansen, Atlanta, GA (US); Ying Liu, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 220 days.

(21) Appl. No.: 13/310,126

(22) Filed: Dec. 2, 2011

(65) Prior Publication Data
US 2012/0137783 A1 Jun. 7, 2012

Related U.S. Application Data

(60) Provisional application No. 61/419,074, filed on Dec. 2, 2010.

(51) Int. Cl.
*H02N 2/18* (2006.01)
*H01L 27/20* (2006.01)

(52) U.S. Cl.
USPC .................................. 310/339; 257/43

(58) Field of Classification Search
None
See application file for complete search history.

(56) References Cited

U.S. PATENT DOCUMENTS

| | | | |
|---|---|---|---|
| 6,586,095 B2 | 7/2003 | Wang et al. |
| 7,220,310 B2 | 5/2007 | Wang et al. |
| 7,351,607 B2 | 4/2008 | Wang et al. |
| 7,705,523 B2 | 4/2010 | Wang et al. |
| 7,898,156 B2 | 3/2011 | Wang et al. |
| 8,039,834 B2 | 10/2011 | Wang et al. |
| 8,053,376 B2 | 11/2011 | Wang et al. |
| 2003/0205657 A1 | 11/2003 | Voisin |
| 2004/0127025 A1 | 7/2004 | Crocker, Jr. et al. |
| 2005/0188751 A1 | 9/2005 | Puskas |
| 2005/0242366 A1 | 11/2005 | Parikh et al. |
| 2007/0188053 A1 | 8/2007 | Stark |
| 2008/0067618 A1 | 3/2008 | Wang et al. |
| 2008/0074002 A1 | 3/2008 | Priya et al. |
| 2008/0282806 A1 | 11/2008 | Chakraborty |
| 2009/0013793 A1 | 1/2009 | Kim et al. |

(Continued)

OTHER PUBLICATIONS

Jeon et al., "MEMS power generator with transverse mode thin film PCT," Science Direct, vol. 122, Issue 1, Jul. 29, 2005, pp. 16-22.

(Continued)

*Primary Examiner* — Andre Allen
(74) *Attorney, Agent, or Firm* — Bryan W. Bockhop; Bockhop & Associates, LLC

(57) ABSTRACT

A generator includes a bio-compatible substrate onto which one mechanical generating unit is disposed. A plurality of elongated piezoelectric fibers each have a first end that is in electrical communication with a first electrode and an opposite second end that is in electrical communication with a second electrode. An insulative layer covers the first electrode, the second electrode and the elongated piezoelectric fibers. A third electrode and a fourth electrode are each disposed on the bio-compatible substrate opposite from the mechanical generating unit. A proton conducting member is in contact with both the third electrode and the fourth electrode. A glucose catalyzing enzyme is electrically coupled to the third electrode. An oxidase enzyme is electrically coupled to the fourth electrode. The third electrode is in electrical communication with each first electrode and the fourth electrode is in electrical communication with each second electrode.

21 Claims, 6 Drawing Sheets

(56) References Cited

U.S. PATENT DOCUMENTS

| | | | |
|---|---|---|---|
| 2009/0066195 A1 | 3/2009 | Wang et al. | |
| 2009/0115293 A1 | 5/2009 | Wang et al. | |
| 2009/0179523 A1 | 7/2009 | Wang et al. | |
| 2009/0209303 A1 | 8/2009 | Kroll et al. | |
| 2010/0026142 A1 | 2/2010 | Jones et al. | |
| 2010/0117488 A1 | 5/2010 | Wang et al. | |
| 2010/0147371 A1 | 6/2010 | Cho | |
| 2010/0171095 A1 | 7/2010 | Wang et al. | |
| 2010/0191153 A1 | 7/2010 | Sanders et al. | |
| 2010/0311143 A1* | 12/2010 | Cheng et al. | 435/177 |
| 2011/0006286 A1 | 1/2011 | Wang et al. | |
| 2011/0051775 A1 | 3/2011 | Ivanov et al. | |
| 2012/0091859 A1* | 4/2012 | Ono et al. | 310/339 |

OTHER PUBLICATIONS

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

PCT/ISA: "Notification of Transmittal of the International Search Report and the Written Opinion of the International Searching Authority, or the Declaration"; Feb. 6, 2013.

* cited by examiner

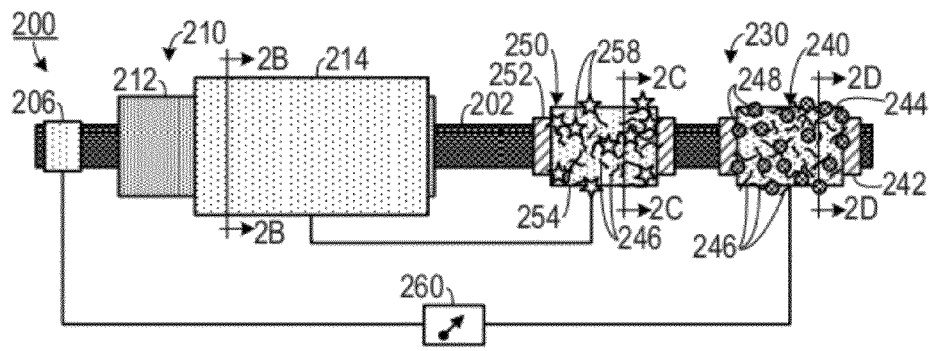
FIG. 2A
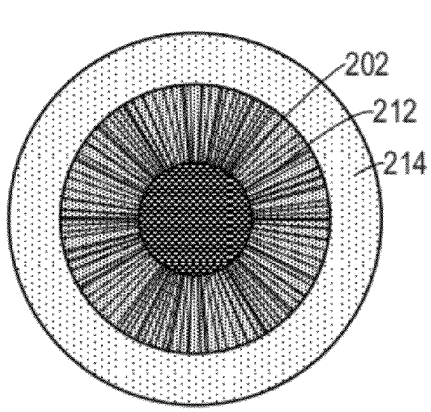
FIG. 2B
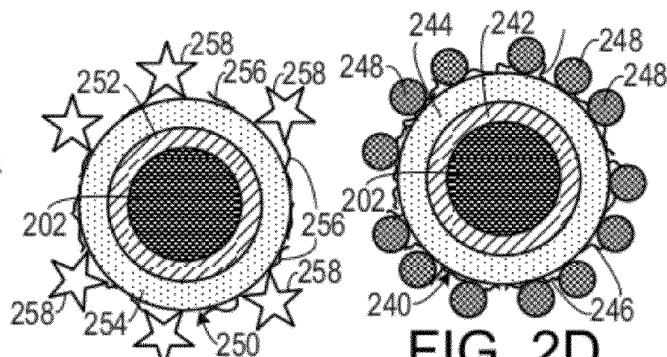
FIG. 2C
FIG. 2D
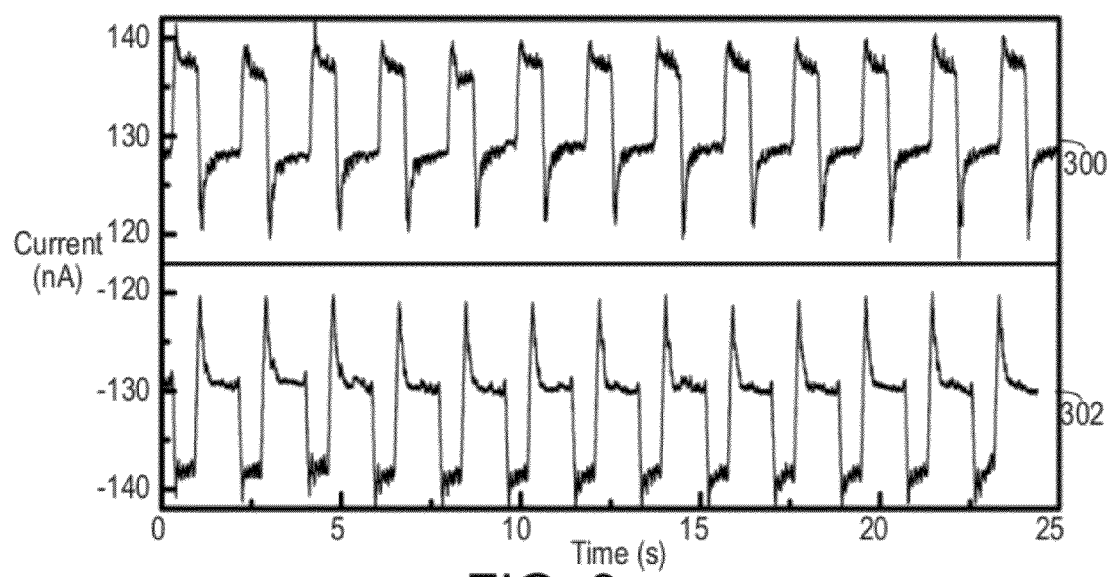
FIG. 3

HYBRID NANOGENERATOR FOR HARVESTING CHEMICAL AND MECHANICAL ENERGY

CROSS-REFERENCE TO RELATED APPLICATION(S)

This application claims the benefit of U.S. Provisional Patent Application Ser. No. 61/419,074, filed Dec. 2, 2010, the entirety of which is hereby incorporated herein by reference.

BACKGROUND OF THE INVENTION

1. Field of the Invention

The present invention relates to electrical electric generators and, more specifically, to a hybrid generator that generates electrical energy from both mechanical energy and chemical energy.

2. Description of the Related Art

The ever increasing energy demand of modern society is perhaps among the greatest challenges humankind is and will continue to face. Research in energy includes such areas as: mega-scale energy conversion, renewable and green energy, efficient energy transmission, energy storage, energy harvesting, and sustainable power source for micro-nano-systems. In addition to large-scale energy harvesting from 'renewable' sources such as wind, hydro, and solar, there is also significant opportunity to harvest the wasted energy in our personal environments, such as from walking, typing, speaking and breathing. If efficiently harvested to its full potential, many of the modern energy requirements needed for small devices and even personal electronics could be fulfilled. This is a new trend in the worldwide effort in developing technologies related to energy scavenging.

Energy harvested from the environment may be sufficient for powering nanodevices used for periodic operation, owing to their extremely low power consumption and small sizes. For example, certain devices can all be foreseen as potential applications that need implantable energy sources, examples include: an implantable device that wirelessly communicates the local glucose concentration for diabetes management; or the local temperature for infection monitoring after surgery; or a pressure difference to indicate blockage of fluid flow in the central nervous system and/or blood clotting. Powering such devices could be accomplished by concurrently harvesting energy from multiple sources within the human body, including mechanical and biochemical energy to augment or even replace batteries. However, powering implantable nanodevices for biosensing using energy scavenging/harvesting technology is rather challenging because the only available energy in-vivo is mechanical, biochemical, and possibly electromagnetic energy, whereas thermal energy cannot be harvested due to lack of an adequate temperature gradient, and solar energy is not available for devices implanted inside the body.

Recent developments in harvesting mechanical energy by nanowire based nanogenerators (NG) has demonstrated an excellent route for harvesting the biomechanical energy created from tiny physical motion, such as the inhaling/exhaling of lungs or the beat of a heart. In addition, approaches have been demonstrated for converting the biochemical energy of glucose/$O_2$ in biofluid using active enzymes as catalysts in a compartment-less biofuel cell (BFC).

Existing systems, however, usually harvest energy from a single available sources. This limits that amount of energy available for implantable devices.

Therefore, there is a need for an energy harvesting system that harvests energy more than one available source.

SUMMARY OF THE INVENTION

The disadvantages of the prior art are overcome by the present invention which, in one aspect, is a hybrid generator that includes a bio-compatible substrate. A least one mechanical generating unit is disposed on the bio-compatible substrate. The mechanical generating unit includes a first electrode and a spaced apart second electrode. A plurality of spaced apart elongated piezoelectric fibers each have a first end that is in electrical communication with the first electrode and an opposite second end that is in electrical communication with the second electrode. An insulative layer covers the first electrode, the second electrode and the plurality of spaced apart elongated piezoelectric fibers. A third electrode and a fourth electrode are each disposed on the bio-compatible substrate opposite from the mechanical generating unit. A proton conducting member is disposed so as to be in contact with both the third electrode and the fourth electrode. A glucose catalyzing enzyme is electrically coupled to the third electrode. An oxidase enzyme is electrically coupled to the fourth electrode. The third electrode is in electrical communication with each first electrode and the fourth electrode is in electrical communication with each second electrode.

In another aspect, the invention is a self powered fiber pressure sensor that includes an elongated carbon fiber member, a generating unit and a pressure sensing unit. The elongated carbon fiber member has a first end and an opposite second end. The generating unit includes a first insulator layer disposed about a portion of the elongated carbon fiber member adjacent the first end, a cathode disposed about a portion of the first insulator unit, the cathode including a first conductor to which is coupled a glucose catalyzing enzyme, a second insulator layer disposed about a portion of the elongated carbon fiber member and spaced apart from the first insulator layer, and an anode disposed about a portion of the second insulator unit, the anode including a second conductor to which is coupled a an oxidase enzyme. The pressure sensing unit includes a third electrode disposed adjacent to the second end and in electrical communication with the elongated carbon fiber member. A dense plurality of piezoelectric nanowires extends radially outwardly from the elongated carbon fiber member. The dense plurality of piezoelectric nanowires is spaced apart from the third electrode. Each of the dense plurality of piezoelectric nanowires has a proximal end adjacent to the elongated carbon fiber member and an opposite distal end. A fourth electrode is in electrical communication with the distal ends of at least a set of the piezoelectric nanowires and is electrically coupled to the anode. A current sensor is in electrical communication with the cathode and the third electrode and is configured to sense a current therebetween. The current is indicative of a pressure applied to the dense plurality of piezoelectric nanowires.

In yet another aspect, the invention is a method of making a nanogenerator, in which a first elongated electrode and a spaced apart second elongated electrode are deposited onto a first side of a biocompatible polymer substrate. A parallel plurality of piezoelectric nanofibers is applied across the first electrode and the second electrode. A top electrode portion is deposited on top of each of the first electrode and the second electrode, thereby affixing the piezoelectric nanofibers thereto. The nanofibers, the first electrode and the second electrode are coated with a first protective biocompatible polymer layer. A third elongated electrode and a spaced apart fourth elongated electrode are deposited onto a second side, opposite the first side, of the biocompatible polymer substrate. A proton conducting member is coupled to the third elongated electrode and the fourth elongated electrode. A plurality of carbon nanotubes is applied to at least one of the third elongated electrode and the fourth elongated electrode. A glucose catalyzing enzyme is applied to the third elongated electrode. An oxidase enzyme is applied to the fourth elongated electrode. The first elongated electrode and the third elongated electrode are electrically coupled to a first node. The second elongated electrode and the fourth elongated electrode are electrically coupled to a second node, different from the first node.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 2A is a schematic side view diagram of a pressure sensor.

FIG. 2B is a cross sectional view of the pressure sensor shown in FIG. 2A, taken along 2B-2B.

FIG. 2C is a cross sectional view of the pressure sensor shown in FIG. 2A, taken along 2C-2C.

FIG. 2D is a cross sectional view of the pressure sensor shown in FIG. 2A, taken along 2D-2D.

FIG. 3 is a graph showing the current response of the sensor shown in FIGS. 2A-2D to a simulated heartbeat.

DETAILED DESCRIPTION OF THE INVENTION

Figure 1A:
FIGS. 1A-1O is a series of side elevational view schematic diagrams showing one method of making a hybrid generator, except for FIG. 1C, which is a top plan view.
Figure 1B:
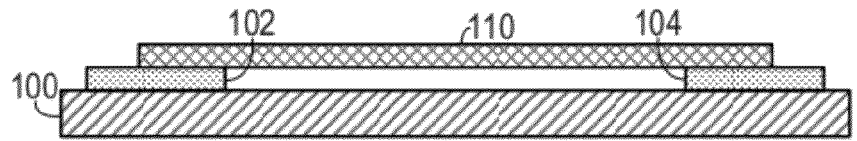
Figure 1C:
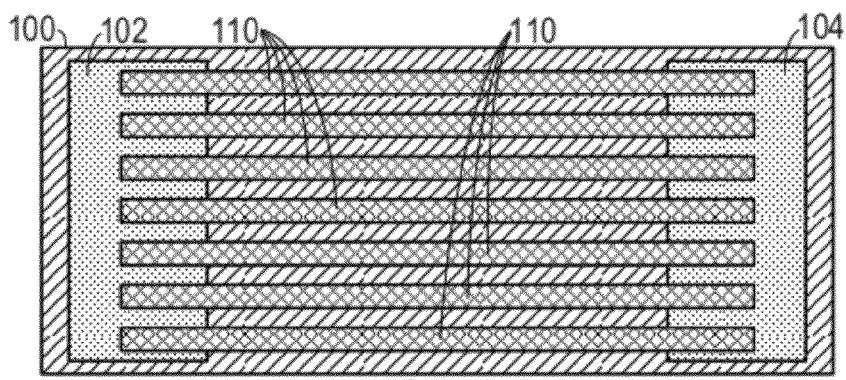
Figure 1D:
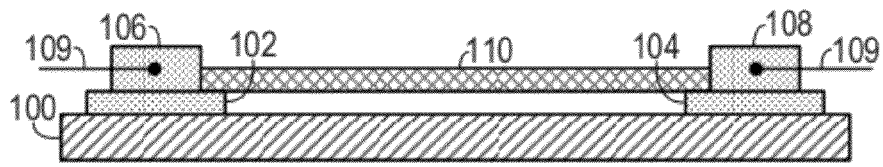

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

U.S. Pat. Nos. 7,220,310, 7,351,607 and 7,982,370, both issued to Wang et al. and U.S. Patent Application Publication Nos. US-2010-0117488-A1 and US-2010-0326503-A1, both filed by Wang et al., disclose various methods for generating piezoelectric nanostructures that may be suitable for generating piezoelectric nanowires in the present invention and, therefore, these patents and publications are incorporated herein by reference.

As shown in FIGS. 1A-1D, in one method for making a hybrid nanogenerator, a first conductive electrode 102 (such as a gold electrode) and a spaced apart second conductive electrode 104 (also, such as a gold electrode) are deposited onto a bio-compatible substrate 100 (such as a polyimide substrate). A plurality of spaced apart elongated piezoelectric fibers 110 is placed across first conductive electrodes 102 and the second conductive electrode 104 so as to be in electrical communication with each electrode. The elongated piezoelectric fibers 110 could include, for example, a copolymer vinylidenefluoride, a trifluoroethylene or a piezoelectric poly (vinylidene)fluoride. The elongated piezoelectric fibers 110 could be applied through an electrospinning process in which they are deposited in a suspension and subjected to an electrical field so as to give them a common orientation while the suspension is allowed to dry. Alternately, they can be extruded onto the electrodes by placing the substrate 100 on a translation table, which moves the substrate 100 along a raster-like pattern while the material from which the fibers are formed is extruded onto the substrate 100. A pair of top electrode films 106 and 108 (which could each include gold) is deposited onto the first electrode 102 and the second electrode 104, thereby sealing the fibers 110 thereto. The top electrode films 106 and 108 each include an electrical lead 109 extending therefrom.

Figure 1E:
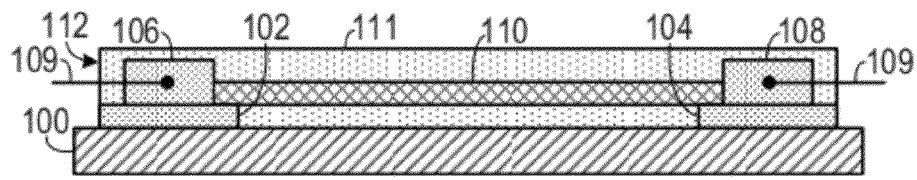
Figure 1F:
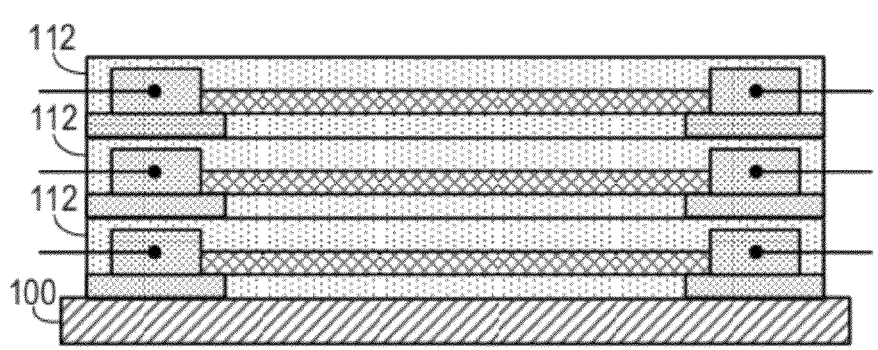

As shown in FIG. 1E, a protective insulative layer 111 (which can include polydimethylsiloxane or a polyimide) is deposited so as to isolate and protect the electrodes and the fibers. Thus, the electrodes 102, 104, 106 and 108, the fibers 110 and the insulative layer 111 form a mechanical generating unit 112. As shown in FIG. 1F, this process can be repeated so that several times so as to make a stack of mechanical generating units 112.

Figure 1G:
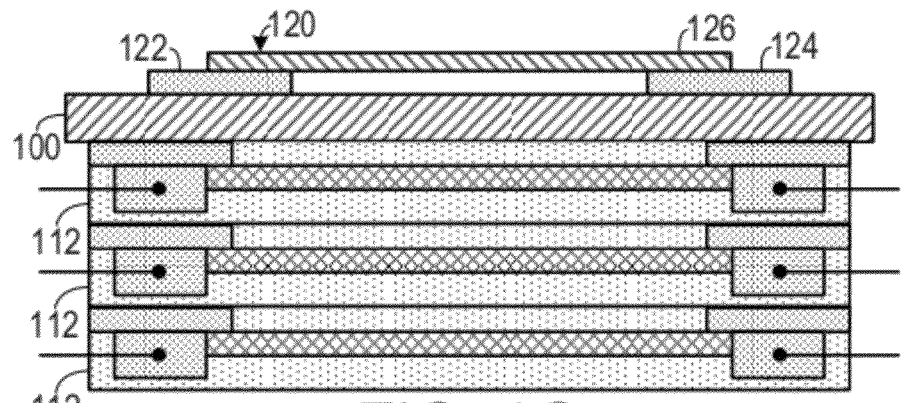
Figure 1H:
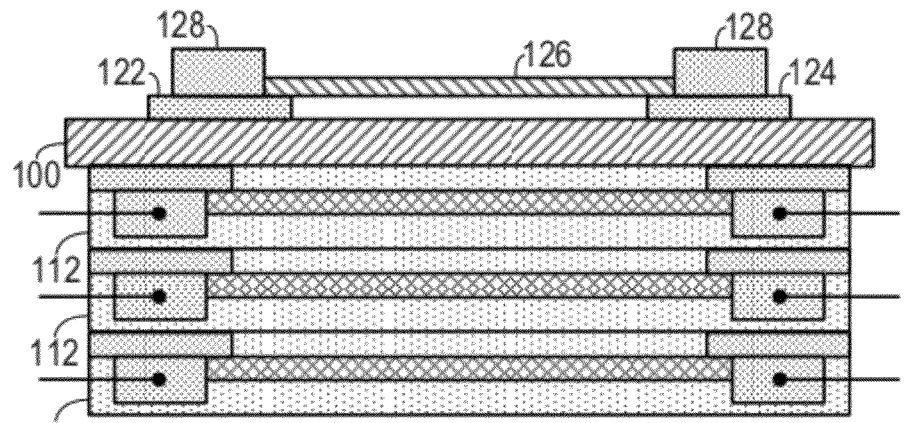

As shown in FIG. 1G, a third electrode 122 and a fourth electrode 124 (both of which could include gold) are each deposited onto the bio-compatible substrate 110 on the side opposite from the mechanical generating units 112. A proton conducting member 126 (such as a layer or fibers made from a sulfonated tetrafluoroethylene based fluoropolymer-copolymer, e.g. Nafion) is disposed so as to be in contact with both the third electrode 122 and the fourth electrode 124. As shown in FIG. 1H, two electrodes 128 can then be applied to fix the proton conducting member 126.

Figure 1I:
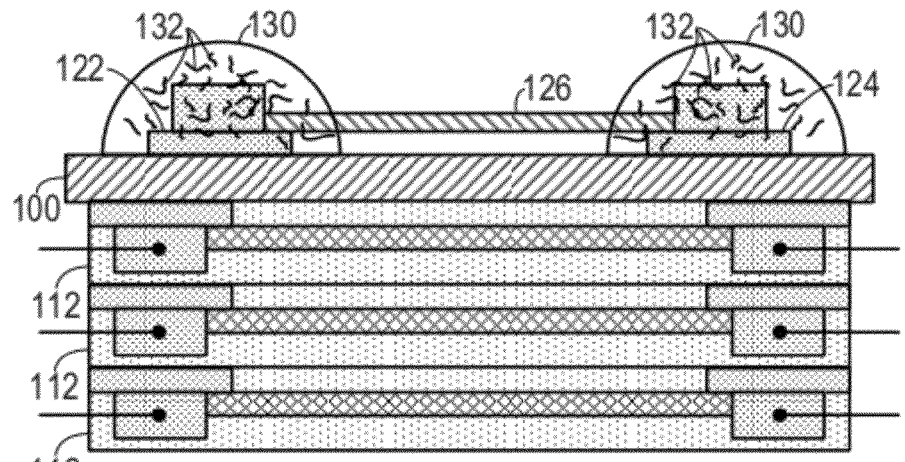
Figure 1J:
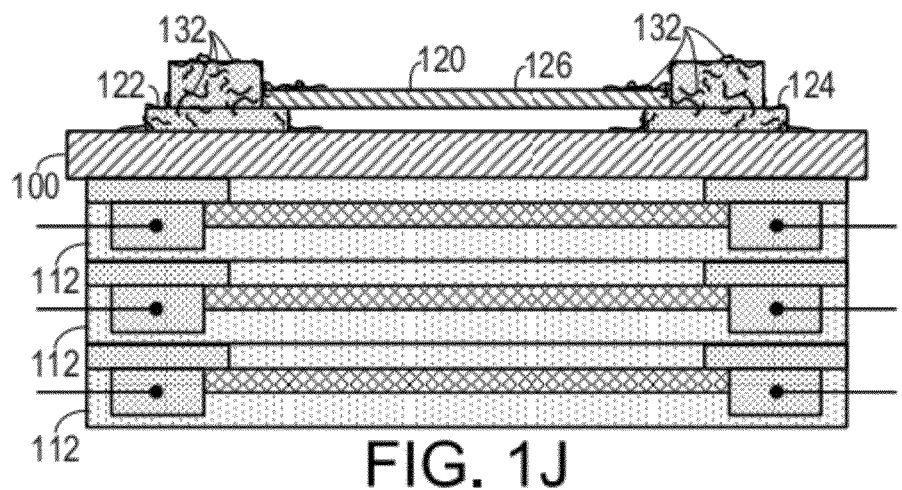
Figure 1K:
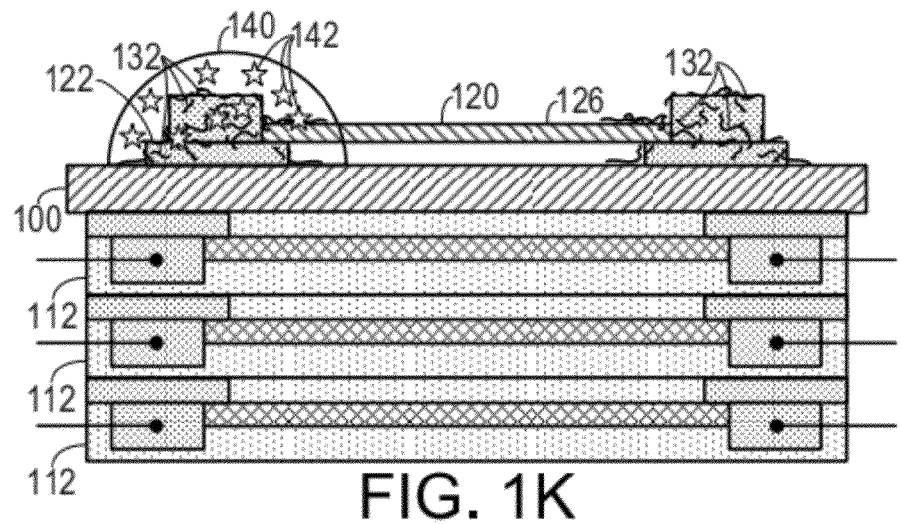
Figure 1L:
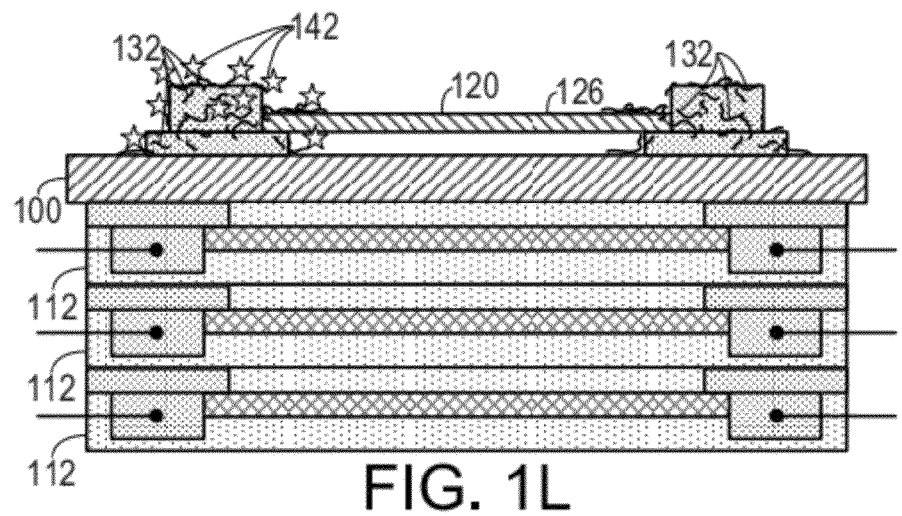
Figure 1M:
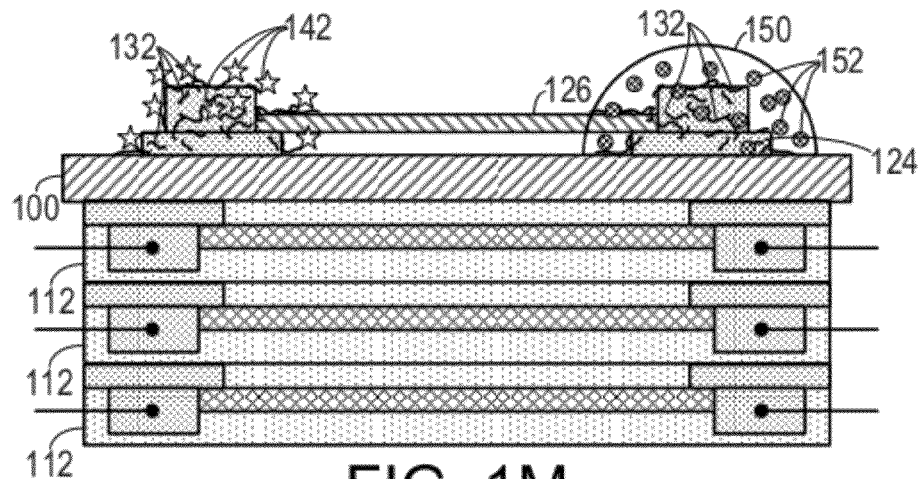
Figure 1N:
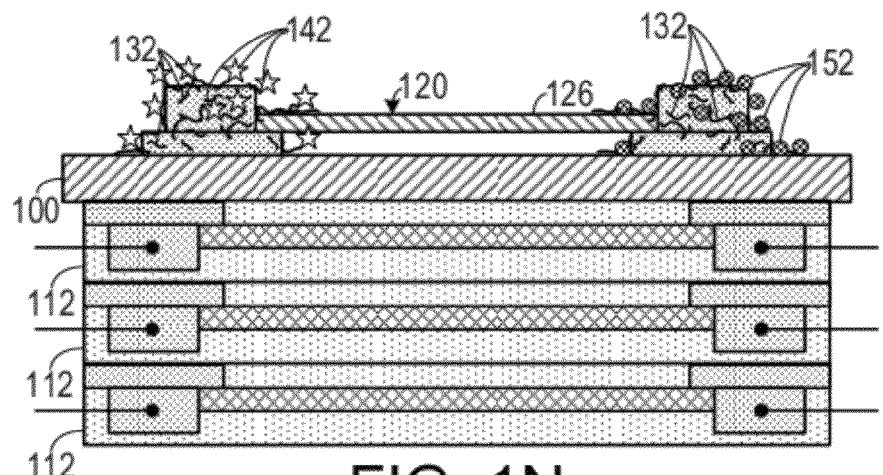

As shown in FIGS. 1I-1J, a plurality of carbon nanotubes 132 are applied to the third electrode 122 and the fourth electrode 124 by suspending the nanotubes 132 in a liquid 130 such as ethanol. As the liquid 130 evaporates, the nanotubes 132 settle on the electrodes 122 and 124. As shown in FIGS. 1K-1L, a glucose catalyzing enzyme 142 (such as glucose oxidase) is electrically coupled to the third electrode 122 by suspending it in a liquid 140, which is allowed to evaporate. The glucose catalyzing enzyme 142 is stabilized by the carbon nanotubes 132. As shown in FIGS. 1M-1N, an oxidase enzyme 152 (such as laccase) is electrically coupled to the fourth electrode 124 by suspending it in a liquid 150, which is allowed to evaporate. The oxidase enzyme 142 is stabilized to the fourth electrode 124 by carbon nanotubes 132. This forms a chemical generating unit 120.

Figure 1O:
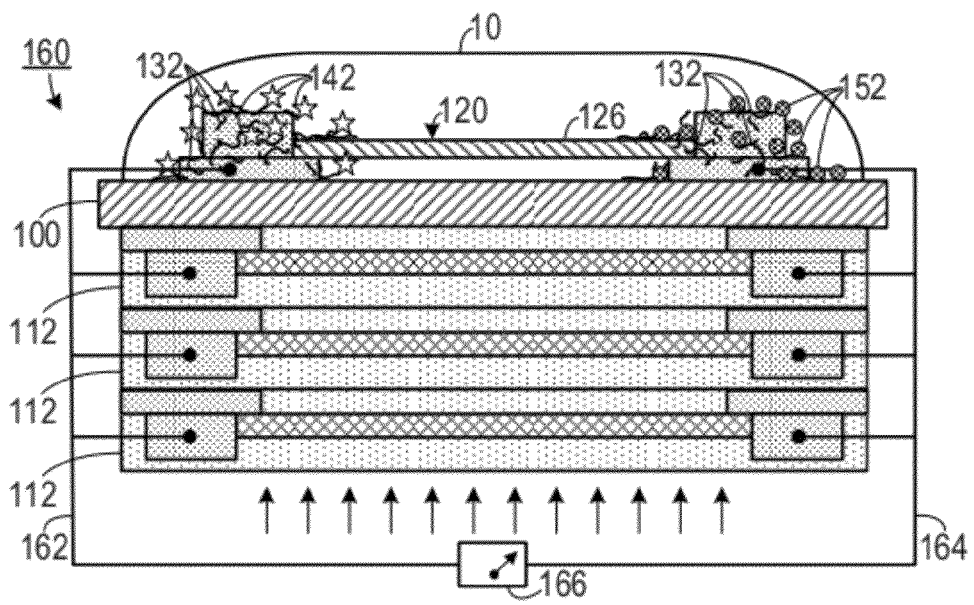

As shown in FIG. 1O, the electrodes on each side of the resulting hybrid generator 160 are coupled to either a first node 162 or a second node 164, each of which are coupled to a load 166. When a liquid 10 containing a chemical fuel, such as glucose comes in contact with the chemical generating unit 120, the chemical generating unit 120 will convert chemical energy to electrical energy. In parallel with this, when a force is applied to the mechanical generating units 112, as represented by the series of up-pointing arrows, the mechanical generating units 112 will convert the mechanical energy to electrical energy.

In one experimental embodiment, PVDF nanofibers were used as the working component for the mechanical energy harvester. Near-field electrospinning was used to synthesize the single PVDF NFs, where the high electric field used to draw the NF was suggested to naturally align the dipoles along the NF long axis. Alternatively, conventional electrospinning with the two electrode technique was used to synthesize and pattern an array of aligned NFs, followed by a post, in-plane poling process. Fourier Transform Infrared Spectroscopy (FTIR) was used to characterize the crystal phases present in the PVDF NFs. A mixture of the polar β phase and the non-polar α and γ phases was indexed. The random dipole orientation of the polar β phase was oriented by encasing the device in PDMS and performing high-field (~0.2 MV/cm) in-plane poling for ~15 minutes.

The working principle of the PVDF NG is based on the insulating property of the PVDF NF and the creation of an inner piezoelectric field during applied tensile strain. As the device is deformed under alternating compressive and tensile force, the NF acts like a "capacitor" and "charge pump," which drives a flow of electrons back and forth through the external circuit. This charging and discharging process results in an alternating current power source.

An enzymatic BFC was used to convert the chemical energy of glucose and oxygen in biofluid into electricity. The electrodes were patterned onto Kapton film and coated with multi-wall carbon nanotubes (MWCNTs), followed by immobilization of glucose oxidase (GOx) and laccase to form the anode and cathode, respectively (see Experimental Methods for details). In addition to immobilizing the enzymes onto the electrodes, CNTs help promote the electron transfer between the enzymes and the electrodes. When the device is in contact with a biofluid that contains glucose (such as blood), the corresponding chemical processes occurring at the two electrodes is that: glucose is electro oxidized to gluconolactone at the anode:

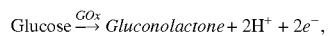

$$\text{Glucose} \xrightarrow{GOx} \text{Gluconolactone} + 2H^+ + 2e^-,$$

and dissolved $O_2$ is electro reduced to water at the cathode:

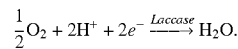

$$\frac{1}{2}O_2 + 2H^+ + 2e^- \xrightarrow{Laccase} H_2O.$$

One of the major hurdles of a glucose/$O_2$ BFC is the performance degradation over time due to the decay of the living enzymes. Therefore, a hybrid BFC-NG which concurrently harvests mechanical and biochemical energy is highly attractive for its increased power output and lifetime. The BFC has the benefit of high power density, whereas the PVDF NG has the benefit of potentially operating over much longer times, since the lifetime is only limited by the mechanical fatigue of the device and can eventually be engineered to last.

To integrate the AC voltage of the PVDF NG with the DC voltage of the BFC, a simple RC high pass filter can be used, which effectively blocks the DC voltage of the BFC in one direction while passing the AC voltage of the NG. By integrating the two devices, the peak voltage was nearly doubled from ~50 mV to ~95 mV. Furthermore, the PDMS packaging of the PVDF NG allows for operation inside biofluid and in-vivo environments. In addition, using a flexible Kapton film substrate for the BFC permits the devices to be integrated back-to-back.

The power output of the hybrid nanogenerator is the sum of the BFC and NG. The voltage output of the BFC is $V_{BFC}$ and the output voltage of the ac NG is $\pm V_{NG}$. Considering the infinitely large resistance of the PVDF nanofiber, the output voltage of the NG component is $\pm V_{NG}$ even with the presence of a load. The inner resistance of the BFC is rather low since it is dictated by electron transfer between the active center of the enzymes and the CNT electrodes. In such a case, the voltage applied to an external load R is $V_{BFC} \pm V_{NG}$, which gives an output power of $(V_{BFC} \pm V_{NG})^2/R$. The average peak output power for each cycle of the mechanical action is $[(V_{BFC}+V_{NG})^2/R+(V_{BFC}-V_{NG})^2/R]/2=(V_{BFC})/R+(V_{NG})^2/R$. In addition, methods can eventually be developed for rectification of the a.c. NG output to obtain a d.c. signal and integration with the d.c. output of the BFC to give an overall enhanced d.c. output.

In one experimental embodiment, PVDF powder (MW 534,000) was purchased from Sigma-Aldrich and used as received. 1.5 g PVDF was dissolved in a mixture of 3 mL DMF (VWR) and 7 mL Acetone (VWR), and heated at 60° C. for 30 min so that the solution is homogeneous. The transparent viscous solution is transferred into a Hamilton 1 mL syringe for electrospinning. A Chemyx Fusion 200 syringe pump and Betran DC High Voltage power supply was used, a voltage of 12 kV was applied to the syringe needle and a feed rate of 50 μL/min was used. The electrospun fibers were collected onto two grounded copper pieces with a 2 cm gap, placed 15 cm away from the needle, and the fibers were electrostatically aligned across the electrode gap.

A 1 cm×2 cm×30 μm Kapton thin film available from Dupont was used as the supporting substrate. To form two electrodes a 50 nm thick layer of Au was deposited onto the Kapton substrate, leaving a 1 mm uncoated gap in the middle by using a mask. The electrospun fibers were carefully transferred across the Au electrodes and electrically bonded using silver paint. A 0.5 mm layer of PDMS was deposited over the device for dielectric protection and biocompatibility. The final device was dipped into paraffin oil, and 20 kV was applied between the two electrodes for 15 minutes. After poling, the electrodes were shorted for over 12 hrs.

Glucose oxidase (GOx, from Aspergillus Niger, type X-S) and laccase powder (from Trametes versicolor) were purchased from Sigma-Aldrich, multi-wall carbon nanotubes from Hanhwa Nanotech (diameter 3~9 nm, purity>95%) and phosphate buffer solution (PBS, pH 7.0) from Fluka. Carbon nanotubes were dissolved in ethanol and sonicated for 1 h to form 2 g/L dispersion. A 4 g/L solution of GOx in phosphate buffer solution and a 4 g/L solution of laccase in phosphate buffer solution was prepared. The Kapton film with Au electrodes were prepared as described and then bleached and rinsed with deionized water before use. 2 μL of CNT dispersion was deposited onto both electrodes, and was rinsed with deionized water after drying. 2 μL GOx solution was then deposited onto one of the CNT/Au electrodes to form the anode and 2 μL of laccase solution was deposited onto the other to form the cathode. The device was then stored under 4° C. for at least 4 hrs before use. Prior to use, the electrodes were rinsed in pure PBS.

A voltage preamplifier (Stanford Research Systems, Model SR560) and a current preamplifier (Stanford Research Systems, Model SR560) were used to measure voltage and current output of the devices, respectively. A labview program was used to monitor and record the measurement. A DC linear motor was used to provide strain for the nanogenerator measurement. A Nicolet Magna IR 560 spectrometer was used to obtain the FTIR transmission spectrum of a 1 mm thick layer of PVDF nanofibers. Prior to SEM imaging, PVDF nanofibers were deposited onto silicon substrate and coated with a thin (~5 nm) layer of Au. The Surface morphology of the PVDF nanofibers was analyzed using a LEO 1530 SEM at 5 kV accelerating voltage.

As shown in FIGS. 2A-2D, a self powered fiber pressure sensor 200 includes an elongated conductive member 202 (such as a carbon fiber or a carbon fiber bundle) having a first end and an opposite second end. A chemical generating unit 230 includes a first insulator layer 252 disposed about a portion of the elongated carbon fiber 202 member. A cathode 250 is disposed about a portion of the first insulator unit 252, the cathode includes a first conductor 252 to which is coupled glucose oxidase 258, which is stabilized with carbon nanotubes 246. A second insulator layer 242 is disposed about a portion of the elongated carbon fiber member 252 and is spaced apart from the first insulator layer 252. An anode 240 is disposed about a portion of the second insulator unit 242. The anode includes a second conductor 244, to which is coupled laccase 248 stabilized by carbon nanotubes 246.

Figure 4:
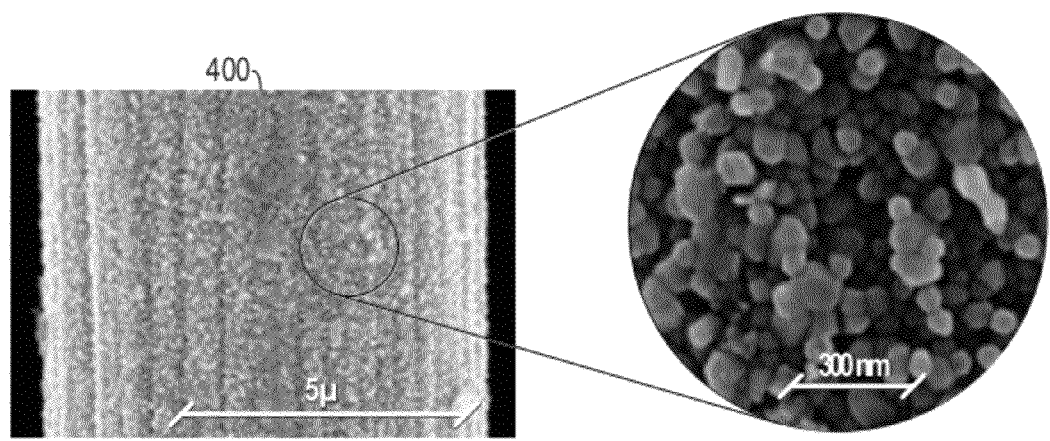
FIG. 4 is a micrograph of a dense plurality of piezoelectric nanowires and a micrograph detail of a portion of the dense plurality.

A pressure sensing unit 210 includes a third conductor 206 disposed adjacent to the second end and in electrical communication with the elongated conductive member 202. A dense plurality of piezoelectric nanowires 212 (such as monocrystalline zinc oxide nanowires) extends radially outwardly from the elongated conductive member 202. The dense plurality of piezoelectric nanowires, which are shown in a micrograph 400 in FIG. 4, are spaced apart from the third conductor 206. Each of the dense plurality of piezoelectric nanowires 212 has a proximal end adjacent to the elongated conductive member 202 and an opposite distal end. A fourth conductor 214 is in electrical communication with the distal ends of at least a set of the piezoelectric nanowires 212 and is electrically coupled to the anode 250.

A current sensor 260 is in electrical communication with the cathode 240 and the third electrode 206. The current sensor 260 is configured to sense a current therebetween and the current is indicative of a pressure applied to the dense plurality of piezoelectric nanowires 212. As shown in FIG. 3, in one experimental embodiment, a plot 300 of an electrical current in a liquid subjected to a simulated heartbeat was measured by connecting the chemical generating unit 230 in series with the pressure sensing unit 210. A pressure of 1.35 $P_0$ was applied periodically at 1.9 s period, but with the pressure held for 0.7 s.

In one experimental embodiment, a hybrid nanogenerater was made of a fiber nanogenerater (FNG) and a fiber bio-fuel cell (FBFC) is designed onto a carbon fiber. The design of the FNG is based on the textured ZnO NW film grown on the surface of the carbon fiber. The carbon fiber serves not only as the substrate on which the ZnO NW film is grown, but also as an electrode (noted as core electrode). The FNG was fabricated by etching the ZnO NW film at one end of the carbon fiber, contacting the top surface using the silver paste and tape, and leading out two electrodes from the surface and the core electrodes. A FBFC, which is for converting chemical energy from biofluid such as glucose/blood into electricity, is fabricated at the other end of the carbon fiber. A layer of soft epoxy polymer is coated on the carbon fiber as an insulator, then two gold electrodes are patterned onto it and coated with carbon nanotubes (CNTs), followed by immobilization of glucose oxidase (GOx) and laccase to form the anode and cathode, respectively. Comparing with traditional biofuel cellsand miniature biofuel cells, the fiber-biofuel cells in this work was integrated with the NG (or nanodevices) on an individual carbon fiber, building a self-powered nanosystem.

The performance of the hybrid NG is characterized by measuring the short circuit current $I_{sc}$ and open circuit voltage $V_{oc}$. The outputs of the FBFC are $V_{FBFC}$ and $I_{FBFC}$, the outputs of the AC FNG are $V_{FNG}$ and $I_{FNG}$ and the outputs of the hybrid NG are $V_{HNG}$ and $I_{HNG}$. When the hybrid NG is immersed into bio-liquid containing glucose, the FBFC starts to generate a DC output. In A typical output of the FBFCs, the $I_{FBFC}$ is about 100 nA and the $V_{FBFC}$ is about 100 mV. Meanwhile, when a pressure is periodically applied to the bio-liquid, the FNG starts to generate an AC output. The general output of $V_{FNG}$ is 3.0 V at an output current of $I_{FNG}$=200 nA for a FNG made of about 1000 carbon fibers, and the corresponding current density is 0.06 µA/cm$^2$.

Also as shown in FIG. 3, the fiber-based hybrid NG can also work as a self-powered nanosystem when the FNG and FBFC are connected in series to form a loop. In such a case, the FNG effectively works as a piezoelectric sensor ('load'), and the FBFC plays the role of the power source that "drives" the FNG, forming a self-powered system for monitoring pressure variation in a bio-liquid. The pressure is applied periodically at an interval of 1.9 s for an extended period of 0.7 s. The base-line current in the circuit is about 128 nA when the bio-liquid is under the ambient atmosphere. When a pressure is applied, a rapid and obvious peak in the measured current is exhibited, and the current increases to a new horizontal level, remaining as a constant after that with the pressure still holding on. When the pressure is released, a rapid and obvious decrease in current is detected. A connection in polarity reversion test is carried out for this process, and the reversion in output signal is apparent (lower part 302), as expected.

The variation of the resistance of the ZnO sensor would be attributed to a combination of bulk resistance change (piezoresistance) and the piezoelectronic effect. The piezoresistive effect, which differs from the piezoelectronic effect, is a change in resistance of a semiconductor due to applied mechanical stress owing to a change in bandgap and local carrier density. The changing of the resistance can be obtained via:

$$\frac{\Delta R}{R} = \pi_l \Delta \sigma_l + \pi_t \Delta \sigma_t^{[13]},$$

where R is resistance, ΔR is the changing of resistance, $\pi_l$ and $\pi_t$ are the transverse and longitudinal piezoresistive effect coefficient, $\Delta \sigma_l$ and $\Delta \sigma_t$ are the changing of the stress applied on the transverse and longitudinal direction of ZnO NWs.

The $\Delta \sigma_t$ is 0.35$P_0$, while $\Delta \sigma_l$ is small enough and can be ignored, $$\frac{\Delta R}{R}$$

is about 10%. If the piezoresistive effect were the dominant contributor, the piezoresistive coefficient π would be 285,000×10$^{-11}$ Pa$^{-1}$. That means that the piezoresistive effect is unlikely to be the dominant contributor for the observed result. The piezoelectric effect is the dominant contributor to the resistance change, which occurs right at the contact with the electrode.

When the ZnO NW film is subjected to a compressive strain, a piezoelectric field is created in the ZnO NW film due to polarization of ions in the crystal, with the positive piezo-potential (V$^+$) at the carbon fiber electrode side, and the corresponding negative side (V$^-$) at the surface electrode side. These non-mobile piezoelectric ionic charges remain in the ZnO NW film for an extended period of time without being fully screened by the free carriers as long as the strain is preserved and doping level is low. As a result, the conduction band and Fermi level of the electrode at the right-hand side is raised by $\Delta\Phi_p=e(V^+-V^-)$ with respect to the electrode on the left-hand side, and electrons will flow from the right-hand side electrode to the left-hand side electrode through an external load that is the FNG in the current case, showing a sharp peak in the measured current. Due to the Schottky barrier, these electrons are accumulated around the interfacial region between the left-hand side electrode and the wire, consequently raising the local Fermi level; this process continues until the potential created by the accumulated electrons balances the piezopotential, and the Fermi levels of the two electrodes reach a new equilibrium, with a SBH $\Phi'_1=\Phi_1-\Delta\Phi<\Phi_1$. As a result, experimentally, the current in the circuit spontaneously increases from 128 nA to 135 nA.

Alternatively, when the compressive strain on the FNG is released, the immediate disappearance of the piezopotential lowers the Fermi level of the right-hand electrode by $\Delta\Phi_p$, and the electrons flow back from the left-hand electrode through the external circuit to the right-hand electrode, creating an electric pulse in the opposite direction, returning the system to its original state. The process ends when the Fermi levels of the two sides reach equilibrium again.

Theoretical calculations have shown that, within the elastic linear mechanics regime, the output voltage of a single nanowire is proportional to the magnitude of its deformation. An increase on the pressure applied to the ZnO NW film leads to the increase of piezopotential $\Delta\Phi_p$, resulting in a higher current jump in the circuit. As the applied pressure increases from ambient atmosphere $P_0$ to 1.05 $P_0$, 1.15 $P_0$, 1.25 $P_0$, then 1.35 $P_0$, the response current increases from 128 nA to 135 nA, nearly 7%. When such a small pressure is applied, the response increases linearly, with a slope about 19.2, following a relationship of $\Delta I/I=0.192\ P/P_0-0.183$. The sensitivity for the pressure measurement demonstrated here is ~1.35%. This means that we can monitor the pressure in a liquid, such as blood pressure in the vessel, by monitoring the current change in the circuit. This is a self-powered hematomanometer.

The self-powered technique detects the pressure (or force) variation by changing the frequency, interval of time and holding time for applying the pressure. Such study is intended for monitoring a tiny pressure variation (or mechanical agitations) in a human's blood vessel. A connection polarity reversion test is carried out for the pressure monitoring process, and the reversion in output signal is apparent. From the current jump in the circuit, we can get the information of the pressure value by calculating via $P=(5.2\Delta I/I+0.95)P_0$.

Such a self-powered nanodevice may have potential applications for healthcare monitoring. The human heart system generates a periodic pulse pressure, which is a complex time-dependent and nonlinear signal reflecting the fluctuation of one's motion and health situation, resulting in a fluctuation in blood pressure. A quantitative measurement of such a pressure signal would provide important information for health care and medical diagnostics. The present self-powered hybrid nanosystem demonstrates the potential to be used for such purpose.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A hybrid generator, comprising:
   (a) a bio-compatible substrate;
   (b) at least one mechanical generating unit disposed on the bio-compatible substrate, including:
      (i) a first electrode and a spaced apart second electrode;
      (ii) a plurality of spaced apart elongated piezoelectric fibers, each having a first end that is in electrical communication with the first electrode and an opposite second end that is in electrical communication with the second electrode; and
      (iii) an insulative layer covering the first electrode, the second electrode and the plurality of spaced apart elongated piezoelectric fibers;
   (c) a third electrode and a fourth electrode, each disposed on the bio-compatible substrate opposite from the mechanical generating unit;
   (d) a proton conducting member disposed so as to be in contact with both the third electrode and the fourth electrode;
   (e) a glucose catalyzing enzyme electrically coupled to the third electrode; and
   (f) an oxidase enzyme electrically coupled to the fourth electrode,
   wherein the third electrode is in electrical communication with the first electrode and wherein the fourth electrode is in electrical communication with the second electrode.

2. The hybrid generator of claim 1, wherein the first glucose catalyzing enzyme comprises glucose oxidase.

3. The hybrid generator of claim 1, wherein the oxidase enzyme comprises laccase.

4. The hybrid generator of claim 1, further comprising a plurality of carbon nanotubes disposed on at least one of the third electrode and the fourth electrode.

5. The hybrid generator of claim 1, wherein the bio-compatible substrate comprises a polyimide.

6. The hybrid generator of claim 1, where each of the plurality of spaced apart elongated piezoelectric fibers comprises a selected one of a copolymer vinylidenefluoride, a trifluoroethylene or a piezoelectric poly(vinylidene)fluoride.

7. The hybrid generator of claim 1, wherein the insulative layer comprises a selected one of a polydimethylsiloxane or a polyimide.

8. The hybrid generator of claim 1, wherein the proton conducting member comprises a sulfonated tetrafluoroethylene based fluoropolymer-copolymer.

9. A self powered fiber pressure sensor, comprising:
   (a) an elongated carbon fiber member having a first end and an opposite second end;
   (b) a generating unit, comprising
      (i) a first insulator layer disposed about a portion of the elongated carbon fiber member;
      (ii) a cathode disposed about a portion of the first insulator unit, the cathode including a first conductor to which is coupled a glucose catalyzing enzyme;
      (iii) a second insulator layer disposed about a portion of the elongated carbon fiber member adjacent to the first end and spaced apart from the first insulator layer; and
      (iv) an anode disposed about a portion of the second insulator unit, the anode including a second conductor to which is coupled a an oxidase enzyme;
   (c) a pressure sensing unit, comprising:
      (i) a third conductor disposed adjacent to the second end and in electrical communication with the elongated carbon fiber member; and (ii) a dense plurality of piezoelectric nanowires extending radially outwardly from the elongated carbon fiber member, the dense plurality of piezoelectric nanowires spaced apart from the third conductor, each of the dense plurality of piezoelectric nanowires having a proximal end adjacent to the elongated carbon fiber member and an opposite distal end, a fourth conductor in electrical communication with the distal ends of at least a set of the piezoelectric nanowires and electrically coupled to the anode; and (d) a current sensor in electrical communication with the cathode and the third conductor and configured to sense a current therebetween, wherein the current is indicative of a pressure applied to the dense plurality of piezoelectric nanowires.

10. The self powered fiber pressure sensor of claim 9, wherein the glucose catalyzing enzyme comprises glucose oxidase.

11. The self powered fiber pressure sensor of claim 9, wherein the oxidase enzyme comprises laccase.

12. The self powered fiber pressure sensor of claim 9, wherein each of the piezoelectric nanowires comprises monocrystalline zinc oxide.

13. A method of making a nanogenerator, comprising the steps of:

(a) depositing a first elongated electrode and a spaced apart second elongated electrode onto a first side of a biocompatible polymer substrate;

(b) applying a parallel plurality of piezoelectric nanofibers across the first electrode and the second electrode;

(c) depositing a top electrode portion on top of each of the first electrode and the second electrode, thereby affixing the piezoelectric nanofibers thereto;

(d) coating the nanofibers, the first electrode and the second electrode with a first protective biocompatible polymer layer;

(e) depositing a third elongated electrode and a spaced apart fourth elongated electrode onto a second side, opposite the first side, of the biocompatible polymer substrate;

(f) coupling a proton conducting member to the third elongated electrode and the fourth elongated electrode;

(g) applying a plurality of carbon nanotubes to at least one of the third elongated electrode and the fourth elongated electrode;

(h) applying a glucose catalyzing enzyme to the third elongated electrode;

(i) applying an oxidase enzyme to the fourth elongated electrode;

(j) electrically coupling the first elongated electrode and the third elongated electrode to a first node; and (k) electrically coupling the second elongated electrode and the fourth elongated electrode to a second node.

14. The method of claim 13, further comprising the step of electrically coupling an electrical load between the first node and the second node.

15. The method of claim 13, further comprising the steps of:

(a) depositing a fifth elongated electrode and a spaced apart sixth elongated electrode onto a first side of a first protective biocompatible polymer layer;

(b) applying a parallel plurality of piezoelectric nanofibers across the fifth electrode and the sixth electrode;

(c) depositing a top electrode portion on top of each of the fifth electrode and the sixth electrode, thereby affixing the piezoelectric nanofibers thereto;

(d) coating the nanofibers and the fifth electrode and the sixth electrode with a protective biocompatible polymer layer;

(e) electrically coupling the fifth electrode to the first node; and (f) electrically coupling the sixth electrode to the second node, different from the first node.

16. The method of claim 13, wherein the glucose catalyzing enzyme comprises glucose oxidase.

17. The method of claim 13, wherein the oxidase enzyme comprises laccase.

18. The method of claim 13, wherein the bio-compatible substrate comprises a polyimide.

19. The method of claim 13, where each of the plurality of spaced apart elongated piezoelectric fibers comprises a selected one of a copolymer vinylidenefluoride, a trifluoroethylene or a piezoelectric poly(vinylidene)fluoride.

20. The method of claim 13, wherein the insulative layer comprises a selected one of a polydimethylsiloxane or a polyimide.

21. The method of claim 13, wherein the proton conducing member comprises a sulfonated tetrafluoroethylene based fluoropolymer-copolymer.

* * * * *